(12) United States Patent
Lee et al.

(10) Patent No.: US 7,863,761 B2
(45) Date of Patent: Jan. 4, 2011

(54) INTEGRATED CIRCUIT PACKAGE SYSTEM WITH MOLDING VENTS

(75) Inventors: Dal Jae Lee, Yeoju-gun (KR); Nam Ju Cho, Uiwang-si (KR); Soo-San Park, Seoul (KR); Jaepil Kim, Icheon-si (KR); Sungpil Hur, Yeouju-kun (KR); Hyeong Kug Jin, Seoul (KR); JongMin Han, Seoul (KR); SungJae Lim, Yongin-si (KR); HyoungChul Kwon, Seoul (KR)

(73) Assignee: Stats Chippac Ltd., Singapore (SG)

( * ) Notice: Subject to any disclaimer, the term of this patent is extended or adjusted under 35 U.S.C. 154(b) by 565 days.

(21) Appl. No.: 11/833,646

(22) Filed: Aug. 3, 2007

(65) Prior Publication Data

US 2008/0029873 A1 Feb. 7, 2008

Related U.S. Application Data

(60) Provisional application No. 60/821,382, filed on Aug. 3, 2006.

(51) Int. Cl.
*H01L 23/28* (2006.01)
*H01L 21/44* (2006.01)

(52) U.S. Cl. ............... 257/787; 257/784; 257/E23.116; 257/E21.504; 438/112; 438/127; 438/617

(58) Field of Classification Search ............... 257/787, 257/E23.116, 784, E21.504; 438/112, 127, 438/617

See application file for complete search history.

(56) References Cited

U.S. PATENT DOCUMENTS

| | | | |
|---|---|---|---|
| 5,635,671 A * | 6/1997 | Freyman et al. | 174/527 |
| 5,971,734 A | 10/1999 | Moon | |
| 6,133,623 A * | 10/2000 | Otsuki et al. | 257/666 |
| 6,268,236 B1 * | 7/2001 | Miyawaki | 438/106 |
| 6,309,916 B1 | 10/2001 | Crowley et al. | |
| 6,576,496 B1 * | 6/2003 | Bolken et al. | 438/110 |
| 6,621,161 B2 * | 9/2003 | Miyawaki | 257/723 |
| 6,825,027 B2 * | 11/2004 | Tauer et al. | 435/239 |
| 6,963,142 B2 | 11/2005 | Bolken | |
| 2002/0070462 A1 * | 6/2002 | Fujisawa et al. | 257/780 |
| 2006/0175710 A1 | 8/2006 | Xie | |

* cited by examiner

*Primary Examiner*—Nitin Parekh
(74) *Attorney, Agent, or Firm*—Mikio Ishimaru (57) ABSTRACT

An integrated circuit package system comprising: providing a substrate; attaching an integrated circuit die over the substrate; attaching a connector to the integrated circuit die and the substrate; and forming an encapsulant over the substrate, the integrated circuit die, and the connector and minimizing ambient gas deformation of the substrate to keep the connector from touching another connector.

20 Claims, 5 Drawing Sheets

INTEGRATED CIRCUIT PACKAGE SYSTEM WITH MOLDING VENTS

CROSS-REFERENCE TO RELATED APPLICATION

This application claims the benefit of U.S. Provisional Patent Application Ser. No. 60/821,382 filed Aug. 3, 2006.

TECHNICAL FIELD

The present invention relates generally to integrated circuit package systems, and more particularly to a system for integrated circuit packages with cavity substrate.

BACKGROUND ART

The demands for less expensive, smaller, higher performance integrated circuit devices have motivated the development of new techniques for producing more efficient semi-conductor devices. While integrated circuit devices are common across many applications including larger electronic systems, such as cars, planes, industrial control systems, the intense demand is in portable electronics, such as cell phones, portable computers, voice recorders, etc.

In the manufacture and assembly of integrated circuits, first, the integrated circuits are formed on semi-conductor wafers. The wafers are separated into individual chips and the individual chips are then handled and packaged. The packaging process is one of the most critical steps in the integrated circuit fabrication process, both from the point of view of cost and of reliability, in that the packaging cost can easily exceed the cost of the integrated circuit chip, and the majority of device failures are packaging oriented.

A key step in the integrated circuit fabrication is packaging the chip in a suitable medium that will protect it in subsequent manufacturing steps and from the environment of its intended application. In the typical packaging process, there are two main steps: wire bonding and encapsulation. Wire bonding connects the leads from the chip to the terminals of the package. The terminals allow the integrated circuit package to be connected to other components of the device. Following wire bonding, encapsulation is employed to seal the surfaces from moisture and contaminants and to protect the wire bonds and other components from corrosion and mechanical shock.

The packaging of integrated circuits has generally involved attaching an individual chip to a lead frame, where following wire bonding and encapsulation, designated parts of the lead frame become the terminals of the package. The packaging of integrated circuits has also involved the placement of a chip on a substrate where, following adhesion of the chip to the surface of the substrate and wire bonding, an encapsulant is placed over the chip and the adjacent substrate to seal and protect the chip and other components.

The known integrated circuit packaging techniques have several disadvantages, particularly with regard to the encapsulation step. In the known techniques, the chip is placed on a lead frame or a flat surface of a flexible board and then a molding process is employed to place an encapsulant over the silicon chip. The molding process generally involves two plates that press against the lead frame or board and attached chip and at least one of the plates includes a mold cavity for molding encapsulant over and around the chip.

In addition to the mold cavities, these plates also have intricate conduits for providing the encapsulant to the mold cavity, commonly called main runners, sub runners, and gates. The main runner provides encapsulant to a multitude of mold cavities; the sub runners provide encapsulant to individual mold cavities; and the gates provide a reduced cross-sectional area where, following the completion of the molding process, the cured encapsulant is cut.

The known techniques for molding encapsulant over a chip attached to a lead frame or the surface of a flexible board have several significant shortcomings. Bond wires can be damaged including wire sagging or wire sweeping. Commonly, wire sagging and wire sweeping result from trapped gases such as air under the substrate. Techniques using pre-heating of temperatures up to about two hundred twenty degrees Celsius and pre-heating times up to about thirty seconds have not provided any significant improvement in reducing wire damage.

Despite the advantages of recent developments in semiconductor fabrication and packaging techniques, there is a continuing need for improving manufacturing processes and increasing the number of packages meeting manufacturing specifications.

Thus, a need still remains for an integrated circuit package system to provide compatibility with existing packaging technologies and improvement in manufacturing process yield. In view of the increasing demand for improved density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a substrate; attaching an integrated circuit die over the substrate; attaching a connector to the integrated circuit die and the substrate; and forming an encapsulant over the substrate, the integrated circuit die, and the connector and minimizing ambient gas deformation of the substrate to keep the connector from touching another connector.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS.

Where multiple embodiments are disclosed and described, having some features in common, for clarity and ease of illustration, description, and comprehension thereof, similar and like features one to another will ordinarily be described with like reference numerals. The embodiments may be numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Figure 1:
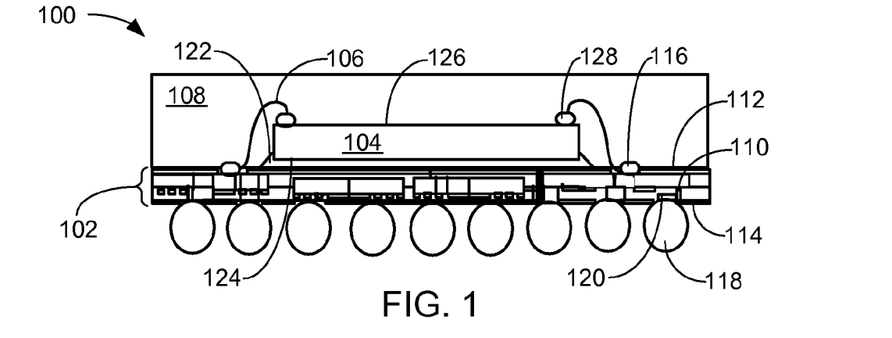
FIG. 1 is a cross-sectional view of an integrated circuit package system taken along line 1-1 of FIG. 2 in a first embodiment of the present invention.
Figure 2:
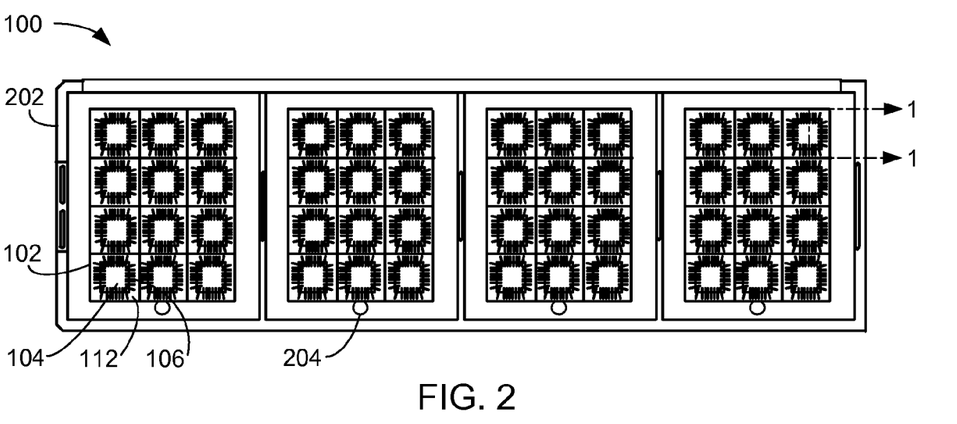
FIG. 2 is a top plan view of the integrated circuit package system.

Referring now to FIG. 1, therein is shown a cross-sectional view of an integrated circuit package system 100 taken along line 1-1 of FIG. 2 in a first embodiment of the present invention. The integrated circuit package system 100 preferably includes a substrate 102, an integrated circuit die 104, a connector 106 such as a bond wire, and an encapsulant 108 such as an epoxy mold compound (EMC). The connector 106 electrically connects the substrate 102 and the integrated circuit die 104. Further, the connector 106 has a spacing predetermined to provide electrical isolation from another of the connector 106.

The substrate 102 can include substrate interconnect 110, a first substrate surface 112 and a second substrate surface 114. The first substrate surface 112 can provide a mounting surface for the integrated circuit die 104 and routing connection sites 116 for the connector 106. The second substrate surface 114 can provide a mounting surface for package connectors 118 over package connection sites 120. The substrate interconnect 110 can electrically connect the routing connection sites 116 and the package connection sites 120.

The integrated circuit die 104 can be mounted over the first substrate surface 112 with a mounting layer 122 such as a die attach adhesive. The mounting layer 122 can provide a substantially fixed position of the integrated circuit die 104 or electrical isolation of a first die surface 124 of the integrated circuit die 104 and the first substrate surface 112. A second die surface 126 of the integrated circuit die 104 can provide die connection sites 128 for electrically connecting the connector 106.

The connector 106 includes characteristics of forming with molding vents (not shown, but see the substrate strip vent 204 in FIG. 2) such as providing the second substrate surface 114 substantially planar, and the encapsulant 108 substantially conformed to the first substrate surface 112. The characteristics of forming with molding vents provide the connector 106 having spacing between the connector 106 and an adjacent of the connector 106.

It has been discovered that the integrated circuit package system 100 with molding vents provides a package in which the substrate 102 remains substantially planar to keep the connector 106 from touching another connector 106 by providing and maintaining a predetermined spacing for electrical isolation from one of the connector 106 and another of the connector 106.

Referring now to FIG. 2 therein is shown a top plan view of the integrated circuit package system 100. The integrated circuit package system 100 is shown without the encapsulant 108 of FIG. 1 for clarity. The integrated circuit package system 100 preferably includes a substrate strip 202 having one or more of the substrate 102. One or more of the integrated circuit die 104 is mounted over the substrate 102. The integrated circuit die 104 and the first substrate surface 112 can be electrically connected with the connector 106.

The substrate strip 202 can preferably include a substrate strip vent 204 such as a molding vent. The substrate strip vent 204 can provide a vent or escape path for an ambient gas such as air during processing such as a molding process. The molding process preferably includes forming the encapsulant 108 of FIG. 1. The encapsulant 108 can be applied over the substrate strip 202, the substrate 102, the integrated circuit die 104, and the connector 106 for providing protection or structural integrity of the integrated circuit package system 100.

For illustrative purposes, the substrate strip 202 is shown having four of a four by three array with the substrate 102 and the integrated circuit die 104 although it is understood that any configuration or number of the substrate 102 or the integrated circuit die 104 may be used.

Figure 3:
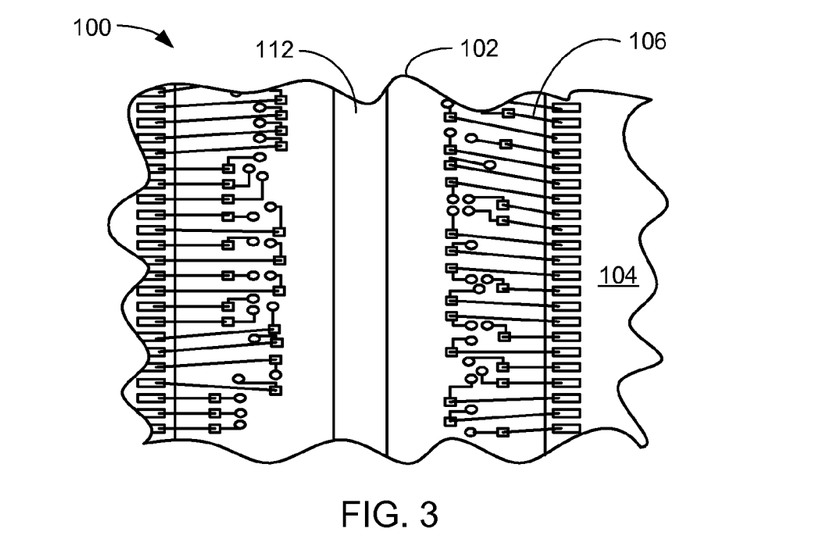
FIG. 3 is a top view of the integrated circuit package system in a connection phase.

Referring now to FIG. 3, therein is shown a top view of the integrated circuit package system 100 in a connection phase. The integrated circuit package system 100 preferably includes the substrate 102, the integrated circuit die 104, and the connector 106. For clarity, only a portion of the integrated circuit package system 100 is shown without the encapsulant 108 of FIG. 1.

The connector 106 includes characteristics of forming with molding vents such as providing the substrate 102 substantially planar, and the encapsulant 108 substantially conformed to the first substrate surface 112.

The characteristics of forming with molding vents provide the connector 106 having the spacing between the connector 106 and an adjacent of the connector 106. The connector 106 is kept from touching another connector 106 by minimizing or reducing the ambient gas deformation or twisting of the substrate 102 and thereby providing a predetermined spacing for electrical isolation from the connector 106 and another of the connector 106.

Figure 4:
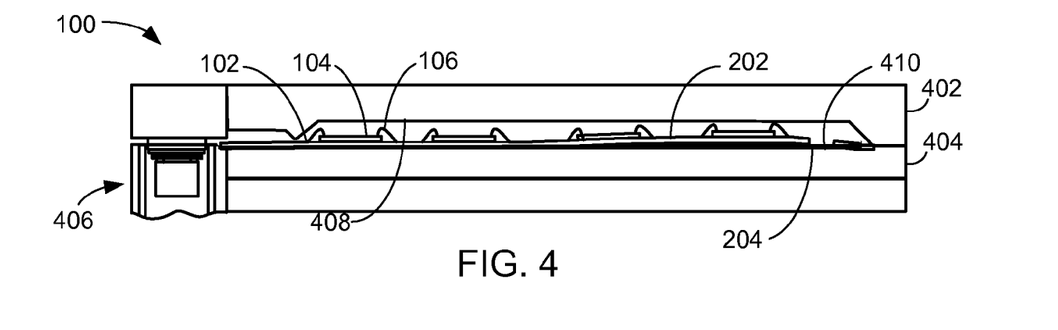
FIG. 4 is a cross-sectional view of the integrated circuit package system in a molding phase.

Referring now to FIG. 4, therein is shown a cross-sectional view of the integrated circuit package system 100 in a molding phase. The integrated circuit package system 100 preferably includes the integrated circuit die 104, the connector 106, the substrate strip 202, and the substrate strip vent 204.

The integrated circuit package system 100 can also include a top mold chase 402, a bottom mold chase 404, and an encapsulant filling apparatus 406 such as a transfer molding device. The encapsulant filling apparatus 406 provides the encapsulant 108 of FIG. 1 over the integrated circuit die 104, the connector 106, and the substrate strip 202.

The encapsulant filling apparatus 406 can transfer the encapsulant 108 to the top mold chase 402 and the bottom mold chase 404. The encapsulant 108 can conform to a top mold inner surface 408 of the top mold chase 402 and optionally to a bottom mold inner surface 410 of the bottom mold chase 404 thereby encapsulating the substrate 102, the integrated circuit die 104, and the connector 106.

Applying the encapsulant 108 can trap and accumulate the ambient gas under the substrate strip 202. The substrate strip vent 204 under the substrate 102 on a side opposite the integrated circuit die 104 can provide a vent or escape path for the ambient gas under the substrate strip 202 minimizing or reducing ambient gas substrate deformation or twisting to keep the connector 106 from touching another connector 106 by providing the predetermined spacing from one of the connector 106 to another of the connector 106.

Figure 5:
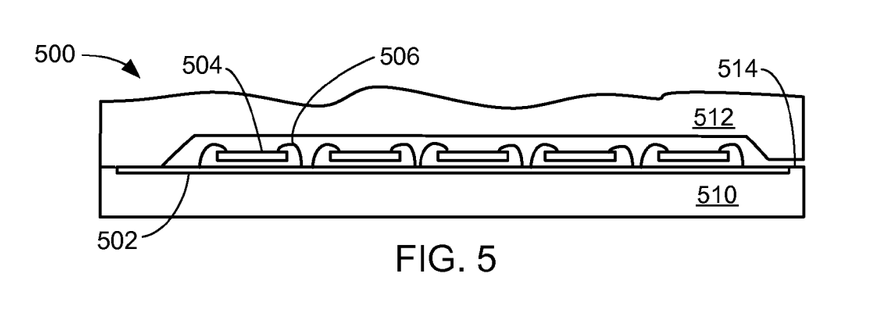
FIG. 5 is a cross-sectional view of an integrated circuit package system taken along line 5-5 of FIG. 8 in a loading phase in a second embodiment of the present invention.
Figure 8:
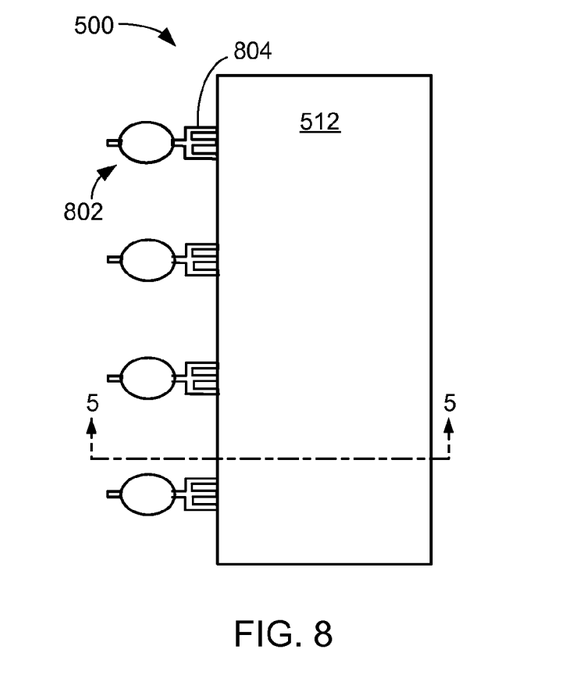
FIG. 8 is a top view of the integrated circuit package system in a molding phase.

Referring now to FIG. 5, therein is shown a cross-sectional view of an integrated circuit package system 500 taken along line 5-5 of FIG. 8 in a loading phase in a second embodiment of the present invention. The integrated circuit package system 500 preferably includes a substrate strip 502, an integrated circuit die 504, and a connector 506 such as a bond wire. The connector 506 electrically connects the substrate strip 502 and the integrated circuit die 504. Further, the connector 506 has a spacing predetermined to provide electrical isolation from another of the connector 506.

The substrate strip 502, the integrated circuit die 504, and the connector 506 can preferably be placed with a bottom mold chase 510 and a top mold chase 512. Only a portion of the top mold chase 512 is shown for clarity. The bottom mold chase 510 and the top mold chase 512 can form a mold chase vent 514. The mold chase vent 514 can provide a vent or escape path for an ambient gas such as air. The vent or escape path can provide significantly improved planarity of the substrate strip 502 during processing particularly in a molding process including heating and venting.

The substrate strip 502 can optionally include molding vents (not shown) such as the substrate strip vent 204 of FIG. 2. The molding vents can optionally provide a vent or escape path for the ambient gas. The vent or escape path of the molding vents can also provide significantly improved planarity of the substrate strip 502 particularly during the molding process.

Figure 6:
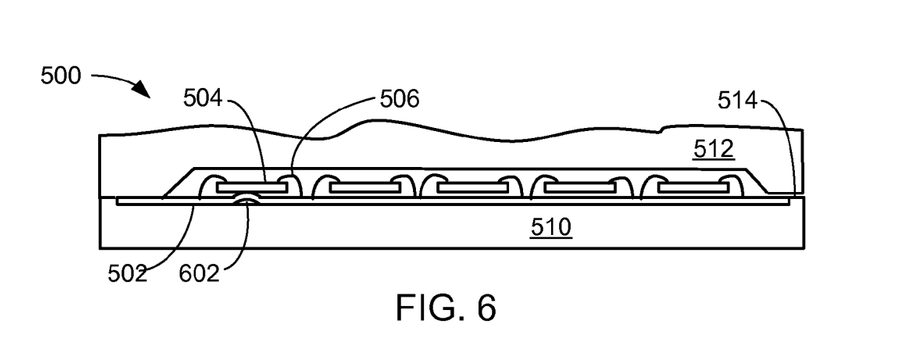
FIG. 6 is a cross-sectional view of the structure of FIG. 5 in a heating phase.

Referring now to FIG. 6, therein is shown a cross-sectional view of the structure of FIG. 5 in a heating phase. The integrated circuit package system 500 preferably includes the substrate strip 502, the integrated circuit die 504, the connector 506, the bottom mold chase 510, the top mold chase 512, and the mold chase vent 514. Heat can be applied with the molding process resulting in a trapped gas region 602 under the substrate strip 502. The trapped gas region 602 can result in spaces between the substrate strip 502 and the bottom mold chase 510 particularly during heating.

The substrate strip 502 over the trapped gas region 602 can be deformed or twisted. Structural integrity and planarity of the substrate strip 502 can be disrupted by the trapped gas region 602 as well as lack of conformance to the bottom mold chase 510. For illustrative purposes, the trapped gas region 602 is shown in more than one location although it is understood that the trapped gas region 602 may be formed in any location or number.

Figure 7:
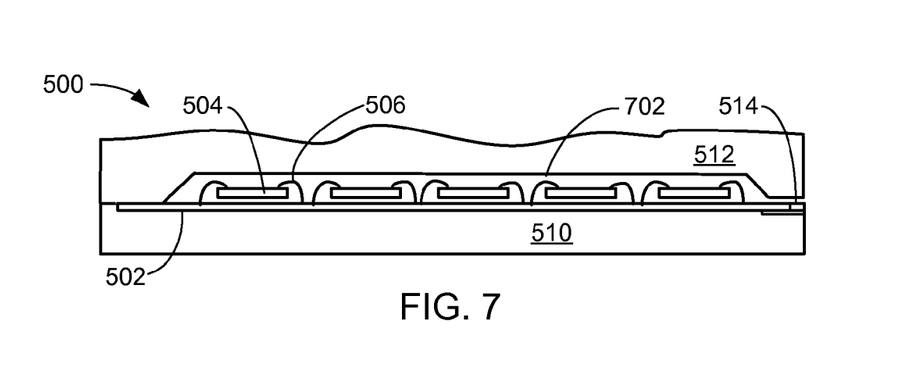
FIG. 7 is a cross-sectional view of the structure of FIG. 5 in a venting phase.

Referring now to FIG. 7, therein is shown a cross-sectional view of the structure of FIG. 5 in a venting phase. The integrated circuit package system 500 preferably includes the substrate strip 502, the integrated circuit die 504, and the connector 506. An encapsulant 702 such as an epoxy mold compound can be applied with the molding process resulting in accumulation of ambient gas of the trapped gas region 602 of FIG. 6 under the substrate strip 502. The mold chase vent 514 formed by the bottom mold chase 510 and the top mold chase 512 can provide a vent or escape path for the ambient gas such as air in the molding process.

The mold chase vent 514 can be formed on a side opposite an entry (not shown) for the encapsulant 702. The connector 506 can include characteristics of forming with the mold chase vent 514 such as a molding vent including providing the substrate strip 502 substantially planar, and the encapsulant 702 substantially conformed to the substrate strip 502. The characteristics of forming with molding vents provide the connector 506 having a predetermined spacing between the connector 506 and an adjacent connector 506.

Referring now to FIG. 8, therein is shown a top view of the integrated circuit package system 500 in a molding phase. The integrated circuit package system 500 can preferably includes the top mold chase 512 and an encapsulant filling apparatus 802 such as a transfer molding device. The encapsulant filling apparatus 802 provides the encapsulant 702 of FIG. 7 over the substrate strip 502 of FIG. 5, the integrated circuit die 504 of FIG. 5, and the connector 506 of FIG. 5.

The encapsulant filling apparatus 802 can include an encapsulant gate 804 for transferring the encapsulant 702 to the top mold chase 512 and the bottom mold chase 510 of FIG. 5. The encapsulant 702 can conform to an inner surface of the top mold chase 512 and an inner surface of the bottom mold chase 510 thereby encapsulating the substrate strip 502, the integrated circuit die 504, and the connector 506.

Figure 9:
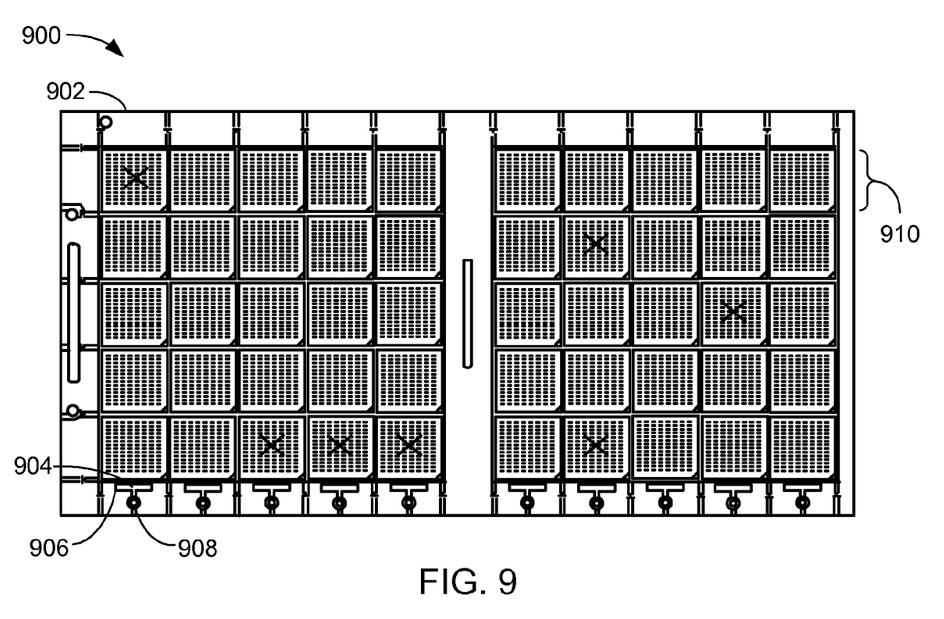
FIG. 9 is a bottom view of an integrated circuit package system in a third embodiment of the present invention.

Referring now to FIG. 9, therein is shown a bottom view of an integrated circuit package system 900 in a third embodiment of the present invention. The integrated circuit package system 900 preferably includes a substrate strip 902 having a metal layer 904 such as copper (Cu). A resist layer 906 such as a solder mask can be applied over the metal layer 904 and the substrate strip 902. The resist layer 906 and the metal layer 904 can be opened to provide a substrate strip vent 908.

The substrate strip vent 908 formed by openings in the resist layer 906 and the metal layer 904 preferably provides a vent or escape path for an ambient gas such as air during processing such as a molding process. For illustrative purposes, the substrate strip 902 is shown having two of a five by five array of mounting regions 910 for individual packages although it is understood that any configuration or number of the mounting regions 910 may be used.

Figure 10:
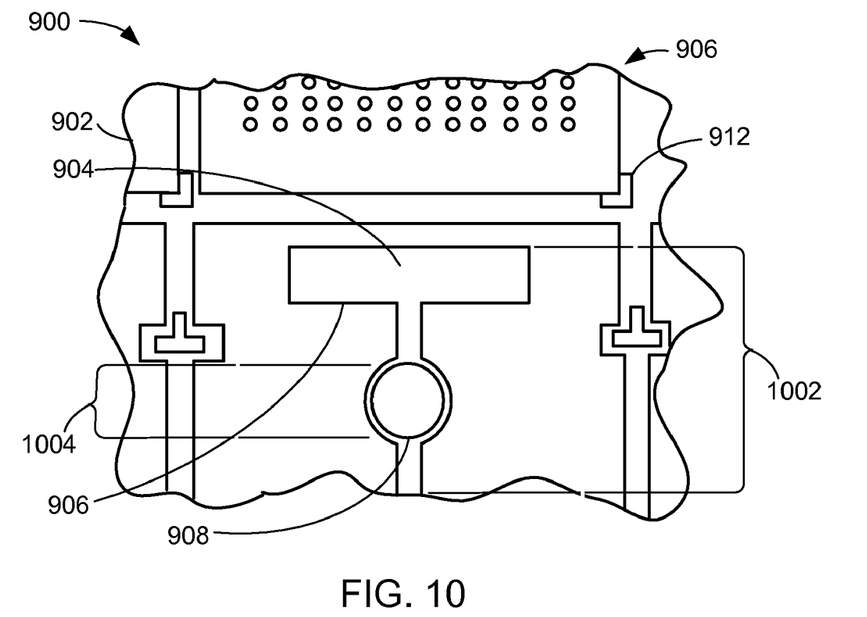
FIG. 10 is a detailed view of the structure of FIG. 9.

Referring now to FIG. 10, therein is shown a detailed view of the structure of FIG. 9. The integrated circuit package system 900 preferably includes the substrate strip 902 having the metal layer 904. The resist layer 906 can be applied over the metal layer 904 and the substrate strip 902. The resist layer 906 and the metal layer 904 can be opened to provide the substrate strip vent 908.

The substrate strip vent 908 formed by a resist layer pattern 1002 of the resist layer 906 and a metal layer pattern 1004 of the metal layer 904 preferably provides the vent or escape path for the ambient gas during processing. The resist layer pattern 1002 can optionally extend beyond the substrate strip vent 908. The substrate strip vent 908 can preferably be formed outside a processing target 912 such as a fiducial mark. The processing target 912 can provide alignment, guidance, or reference for processing.

For illustrative purposes, the resist layer pattern 1002 is shown in substantially the shape of a "T" although it is understood that the resist layer pattern 1002 may be of any shape or size. Further, for illustrative purposes the metal layer pattern 1004 is shown in a shape of a circle although it is understood that the metal layer pattern 1004 may be of any shape or size.

Figure 11:
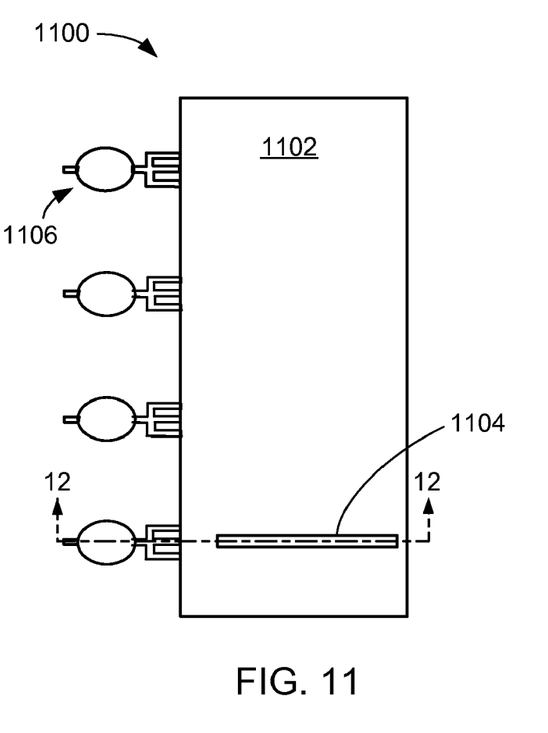
FIG. 11 is a top view of an integrated circuit package system in a fourth embodiment of the present invention.

Referring now to FIG. 11, therein is shown a top view of an integrated circuit package system 1100 in a fourth embodiment of the present invention. The integrated circuit package system 1100 preferably includes a bottom mold chase 1102 having a bottom chase groove 1104. The bottom chase groove 1104 can provide a vent or escape path for the ambient gas such as air in the molding process.

The integrated circuit package system 1100 can also preferably include an encapsulant filling apparatus 1106 such as a transfer molding device. An encapsulation process includes the encapsulant filling apparatus 1106 for providing an encapsulating material such as an epoxy mold compound. The encapsulation process can result in accumulation of the ambient gas. The bottom chase groove 1104 providing the vent or escape path can significantly improve the molding process.

For illustrative purposes, the integrated circuit package system 1100 is shown having four of the encapsulant filling apparatus 1106 although it is understood that any number or configuration of the encapsulant filling apparatus 1106 may be used.

Figure 12:
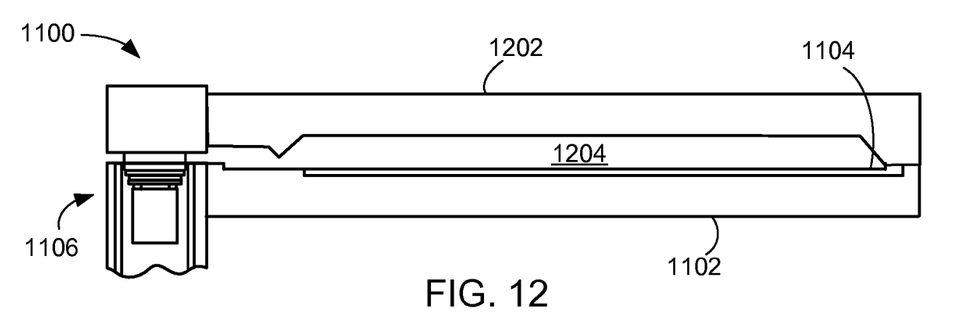
FIG. 12 is a cross-sectional view of the integrated circuit package system taken along line 12-12 of FIG. 11.

Referring now to FIG. 12, therein is shown a cross-sectional view of the integrated circuit package system 1100 taken along line 12-12 of FIG. 11. The integrated circuit package system 1100 preferably includes the bottom mold chase 1102 having the bottom chase groove 1104. A top mold chase 1202 can be placed over the bottom mold chase 1102 to form a molding cavity 1204. The molding process can also include the encapsulant filling apparatus 1106.

The molding process can trap and accumulate the ambient gas in the molding cavity 1204. The bottom chase groove 1104 can provide the vent or escape path for the ambient gas from the molding cavity 1204. The vent or escape path significantly improves devices resulting from application of the molding process.

Figure 13:
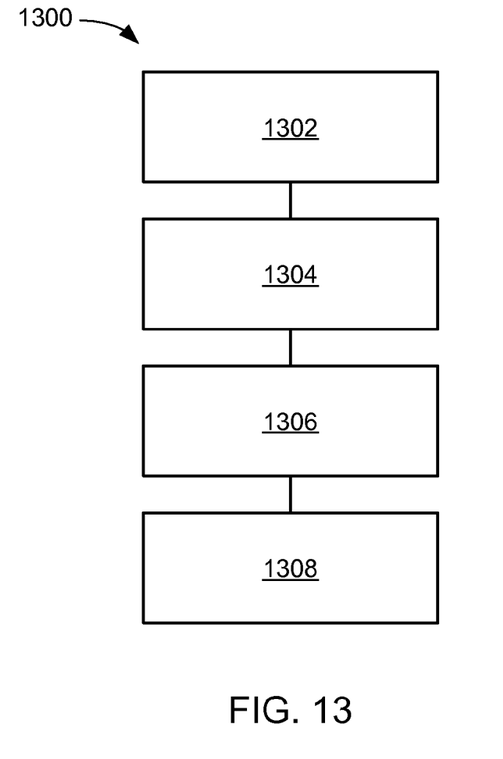
FIG. 13 is a flow chart of an integrated circuit package system for manufacturing the integrated circuit package system in an embodiment of the present invention.

Referring now to FIG. 13, therein is shown a flow chart of an integrated circuit package system 1300 for manufacturing the integrated circuit package system 100 in an embodiment of the present invention. The system 1300 includes providing a substrate in a block 1302; attaching an integrated circuit die over the substrate in a block 1304; attaching a connector to the integrated circuit die and the substrate in a block 1306; and forming an encapsulant over the substrate, the integrated circuit die, and the connector and minimizing ambient gas deformation of the substrate to keep the connector from touching another connector in a block 1308.

In greater detail, a system to provide the method and apparatus of the integrated circuit package system 100, in an embodiment of the present invention, is performed as follows:
1. Providing a substrate.
2. Mounting an integrated circuit die over the substrate.
3. Connecting a connector to the integrated circuit die and the substrate.
4. Forming an encapsulant over the substrate, the integrated circuit die, and the connector and minimizing ambient gas deformation of the substrate to keep the connector from touching another connector.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
   providing a substrate;
   attaching an integrated circuit die over the substrate;
   attaching a connector to the integrated circuit die and the substrate; and
   forming an encapsulant over the substrate, the integrated circuit die, and the connector, the encapsulant formed with a mold the mold having a vent under the substrate on a side opposite the encapsulant on the integrated circuit die and minimizing ambient gas deformation of the substrate.

2. The method as claimed in claim 1 wherein forming the encapsulant includes providing the encapsulant over the connector having a predetermined spacing from another of the connector.

3. The method as claimed in claim 1 wherein providing the substrate includes providing a substrate strip having a substrate strip vent.

4. The method as claimed in claim 1 wherein forming the encapsulant includes forming the encapsulant with a mold chase having a mold chase vent.

5. The method as claimed in claim 1 wherein forming the encapsulant includes forming the encapsulant with a substrate strip having a substrate strip vent and a mold chase having a mold chase vent.

6. A method for manufacturing an integrated circuit package system comprising:
   providing a substrate;
   mounting an integrated circuit die over the substrate;
   connecting a connector to the integrated circuit die and the substrate; and
   forming an encapsulant over the substrate, the integrated circuit die, and the connector, the encapsulant formed with a mold the mold having a vent under the substrate on a side opposite the encapsulant on the integrated circuit die and minimizing ambient gas deformation of the substrate.

7. The method as claimed in claim 6 wherein forming the encapsulant includes maintaining the substrate substantially planar.

8. The method as claimed in claim 6 wherein providing the substrate includes providing a substrate strip having a substrate strip vent outside a processing target.

9. The method as claimed in claim 6 wherein forming the encapsulant includes forming the encapsulant with a bottom mold chase having a bottom chase groove.

10. The method as claimed in claim 6 wherein forming the encapsulant includes forming the encapsulant with a substrate strip having a substrate strip vent and a bottom mold chase having a bottom chase groove.

11. An integrated circuit package system comprising:
a substrate;
an integrated circuit die over the substrate;
a connector connected to the integrated circuit die and the substrate; and
an encapsulant over the substrate, the integrated circuit die, and the connector, the encapsulant formed with a mold the mold having a vent under the substrate on a side opposite the encapsulant on the integrated circuit die having minimized ambient gas deformation of the substrate.

12. The system as claimed in claim 11 wherein the connector further comprises a connector having a predetermined spacing from another of the connector.

13. The system as claimed in claim 11 wherein the substrate further comprises a substrate strip having a substrate strip vent.

14. The system as claimed in claim 11 wherein the encapsulant further comprises an encapsulant having the characteristic of having been formed with a mold chase having a mold chase vent.

15. The system as claimed in claim 11 wherein the encapsulant further comprises an encapsulant having the characteristic of having been formed with a substrate strip having a substrate strip vent and a mold chase having a mold chase vent.

16. The system as claimed in claim 11 wherein:
the encapsulant is over the substrate, the integrated circuit die, and the connector having minimized ambient gas deformation of the substrate to keep a predetermined spacing from the connector to another connector.

17. The system as claimed in claim 16 wherein the substrate within the encapsulant is substantially planar.

18. The system as claimed in claim 16 wherein the substrate further comprises a substrate strip having a substrate strip vent outside a processing target.

19. The system as claimed in claim 16 wherein the encapsulant further comprises an encapsulant having the characteristic of having been formed with a bottom mold chase having a bottom chase groove.

20. The system as claimed in claim 16 wherein the encapsulant further comprises an encapsulant having the characteristic of having been formed with a substrate strip having a substrate strip vent and a bottom mold chase having a bottom chase groove.

* * * * *

UNITED STATES PATENT AND TRADEMARK OFFICE
CERTIFICATE OF CORRECTION

| | | |
|---|---|---|
| PATENT NO. | : 7,863,761 B2 | Page 1 of 1 |
| APPLICATION NO. | : 11/833646 | |
| DATED | : January 4, 2011 | |
| INVENTOR(S) | : Lee et al. | |

It is certified that error appears in the above-identified patent and that said Letters Patent is hereby corrected as shown below:

Column 8:

claim 1, line 9, delete "a mold the mold having" and insert therefor --the mold having-- claim 6, line 9, delete "a mold the mold having" and insert therefor --the mold having--

Column 9:

claim 11, lines 7-8, delete "a mold the mold having" and insert therefor --the mold having--

Signed and Sealed this
Twelfth Day of April, 2011

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,863,761 B2 | Page 1 of 1 |
| APPLICATION NO. | : 11/833646 | |
| DATED | : January 4, 2011 | |
| INVENTOR(S) | : Lee et al. | |

It is certified that error appears in the above-identified patent and that said Letters Patent is hereby corrected as shown below:

Column 8, line 41(claim 1, line 9), delete "a mold the mold having" and insert therefor --the mold having--

Column 8, line 67 (claim 6, line 9), delete "a mold the mold having" and insert therefor --the mold having--

Column 9, lines 25-26 (claim 11, lines 7-8), delete "a mold the mold having" and insert therefor --the mold having--

This certificate supersedes the Certificate of Correction issued April 12, 2011.

Signed and Sealed this
Tenth Day of May, 2011

David J. Kappos
*Director of the United States Patent and Trademark Office*